United States Patent
Asadi et al.

(10) Patent No.: US 11,444,638 B2
(45) Date of Patent: Sep. 13, 2022

(54) QUALITY-BASED DYNAMIC SCHEDULING LDPC DECODER

(71) Applicant: SK hynix Inc., Icheon-si (KR)

(72) Inventors: Meysam Asadi, Fremont, CA (US); Fan Zhang, Fremont, CA (US); Aman Bhatia, Los Gatos, CA (US)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/023,981

(22) Filed: Sep. 17, 2020

(65) Prior Publication Data

US 2022/0085829 A1    Mar. 17, 2022

(51) Int. Cl.
| | |
|---|---|
| *H03M 13/00* | (2006.01) |
| *H03M 13/11* | (2006.01) |
| *H03M 13/09* | (2006.01) |
| *H03M 13/29* | (2006.01) |
| *H03M 13/15* | (2006.01) |

(52) U.S. Cl.
CPC ..... *H03M 13/1131* (2013.01); *H03M 13/096* (2013.01); *H03M 13/116* (2013.01); *H03M 13/1575* (2013.01); *H03M 13/2948* (2013.01)

(58) Field of Classification Search
CPC ........... H03M 13/1131; H03M 13/096; H03M 13/1575; H03M 13/2948
See application file for complete search history.

(56) References Cited

U.S. PATENT DOCUMENTS

| | | | |
|---|---|---|---|
| 10,367,526 B2* | 7/2019 | Liu | H03M 13/1111 |
| 2013/0061107 A1* | 3/2013 | Wang | H03M 13/1137 714/752 |
| 2015/0303942 A1* | 10/2015 | Zhang | H03M 13/1117 714/763 |
| 2015/0326249 A1* | 11/2015 | Zhang | H03M 13/1137 714/763 |
| 2016/0277035 A1* | 9/2016 | Liu | H03M 13/6583 |
| 2017/0117925 A1 | 4/2017 | Achtenberg et al. | |

(Continued)

OTHER PUBLICATIONS

Lee, et al., "Optimization Techniques for the Efficient Implementation of High-Rate Layered QC-LDPC Decoders", Institute of Electrical and Electronics Engineers Transactions on Circuits and Systems I: Regular Papers, vol. 64, Issue 2, Feb. 2017, pp. 457-470.

(Continued)

*Primary Examiner* — Esaw T Abraham
(74) *Attorney, Agent, or Firm* — Weaver Austin Villeneuve & Sampson LLP

(57) ABSTRACT

Techniques related to improving power consumption of an LDPC decoder are described. In an example, the LDPC decoder uses a message passing algorithm between variable nodes and check nodes. A check node processing unit that generates check node to variable node messages implements a plurality of check node processing mode. Operation in each mode consumes a certain amount of power while providing a certain accuracy. Depending on a reliability of a variable node to check node message received by the check node processing unit, an appropriate check node processing mode is selected and used to generate a corresponding check node to variable node message. The reliability can be estimated for a set of variable node to check node messages based on, for instance, syndrome-related parameters.

19 Claims, 7 Drawing Sheets

(56) References Cited

U.S. PATENT DOCUMENTS

| | | |
|---|---|---|
| 2018/0115326 A1 | 4/2018 | Aharony |
| 2019/0132010 A1 | 5/2019 | Shin et al. |
| 2019/0158116 A1 | 5/2019 | Lee et al. |
| 2019/0326930 A1 | 10/2019 | Palangappa et al. |
| 2020/0036395 A1 | 1/2020 | Chen et al. |
| 2020/0119750 A1 | 4/2020 | Heo et al. |
| 2020/0177203 A1 | 6/2020 | Marchand et al. |

OTHER PUBLICATIONS

Ueng, et al., "A Multimode Shuffled Iterative Decoder Architecture for High-Rate RS-LDPC Codes", Institute of Electrical and Electronics Engineers Transactions on Circuits and Systems I: Regular Papers, vol. 57, Issue 10, Oct. 2010, pp. 2790-2803.

\* cited by examiner

QUALITY-BASED DYNAMIC SCHEDULING LDPC DECODER

BACKGROUND

Error-correction codes (ECCs) are typically used for various types of data storage devices include NAND flash memories. ECCs are also frequently used during the process of data transmission. ECC refers to codes that add redundant data, or parity data, to a message, such that the message can be recovered by a receiver even when a number of errors were introduced, either during the process of transmission, or storage. In general, the ECC can correct the errors up to the capability of the code being used. ECC decoding can include soft decoding, such as low-density parity-check code (LDPC) decoding, where a logical value stored in a memory cell can be represented as a probability distribution.

Typically, ECC decoding, including LDPC decoding, a tradeoff is made between error correction capability and power consumption and. Generally, the higher the error correction capability, the more complex the decoding processing and the higher the power consumption become.

BRIEF SUMMARY

Techniques related to improving a power consumption of an ECC decoder are described, where the power consumption can be reduced while maintaining an error correction capability of the ECC decoder.

In an example, a method for decoding a low-density parity-check code (LDPC) codeword is disclosed. The method is implemented on a computing device and includes determining a variable node to check node (V2C) message, wherein the V2C message corresponds to a variable node that is connected to a check node; determining a reliability of a set of V2C messages comprising the V2C message; selecting, based on the reliability, a check node processing mode from a plurality of different check node processing modes; determining a check node to variable node (C2V) message based on the check node processing mode; and decoding the LDPC codeword based on the C2V message.

In an example, the method further includes, during a decoding iteration: determining a syndrome of the LDPC codeword; increasing a decoding iteration number; determining that the increased decoding iteration number does not exceed a maximum number; and determining that the syndrome of the LDPC codeword is not zero.

In the above example, the method can further include, during a next decoding iteration corresponding to the increased decoding iteration number: (a) updating the V2C message corresponding to the variable node; (b) determining that the variable node is associated with a "j" variable node circulant matrix; (c) determining that the check node connected to the variable node is associated with a "k" check node circulant matrix; (d) determining the reliability of the set of V2C messages as $r_{k,j}$=number of ones in $S_k$/CS, where $r_{k,j}$ is the reliability, $S_k$ is a partial checksum computed based on the "k" check node circulant matrix, and CS is a checksum determined from the syndrome of the LDPC codeword; (e) comparing $r_{k,j}$ to a reliability threshold, wherein the check node processing mode is selected based on the comparing; and (f) updating the partial checksum $S_k$.

In the above example, the method can further include, during the next decoding iteration corresponding, repeating steps (a)-(f) for remaining variable node circulant matrices and remaining check node circulant matrices.

In an example, the reliability of the set of V2C messages is determined based on a syndrome of the LDPC codeword.

In the above example, the reliability of the set of V2C messages is further determined based on a partial syndrome associated with a circulant matrix, wherein the check node is associated with the circulant matrix.

In an example, each V2C message in the set of V2C messages corresponds to a different variable node from a set of variable nodes. The set of variable nodes corresponds to a variable node circulant matrix.

In the above example, the check node is associated with a check node circulant matrix, wherein the reliability is determined based on a syndrome of the LDPC codeword and a partial syndrome, wherein the partial syndrome is computed based on the check node circulant matrix.

In the above example, the reliability is determined as r=number of ones in $S_k$/CS, where r is the reliability, $S_k$ is the partial syndrome, and CS is a checksum determined from the syndrome of the LDPC codeword.

In an example, the method further includes: comparing the reliability to a reliability threshold, wherein the check node processing mode is selected based on the comparing.

In the above example, the plurality of different check node processing modes comprises a first check node processing mode and a second check node processing mode, wherein the first check node processing mode approximates a log likelihood ratio of the variable node based on a first quantization level, wherein the second check node processing mode approximates the log likelihood ratio of the variable node based on a second quantization level, wherein the second quantization level is larger than the first quantization level, wherein the first check node processing mode is selected if the reliability is smaller than the reliability threshold, and wherein the second check node processing mode is selected if the reliability is larger than the reliability threshold.

In the above example, the reliability threshold is defined based on a decoding iteration number.

In the above example, the reliability threshold is defined based on a degree of the variable node.

In the above example, the reliability threshold is defined based on a degree of the check node.

In an example, a device is disclosed. The device includes a memory storing a low-density parity-check code (LDPC) codeword; and a set of processing units configured to: determine a variable node to check node (V2C) message, wherein the V2C message corresponds to a variable node that is connected to a check node; determine a reliability of a set of V2C messages comprising the V2C message; select, based on the reliability, a check node processing mode from a plurality of different check node processing modes; and determine a check node to variable node (C2V) message based on the check node processing mode, wherein the LDPC codeword is decoded based on the C2V message.

In the above example, the set of processing units is further configured to, during a decoding iteration: determine a syndrome of the LDPC codeword; increase a decoding iteration number; determine that the increased decoding iteration number does not exceed a maximum number; and determine that the syndrome of the LDPC codeword is not zero.

In the above example, the set of processing units can further be configured to, during a next decoding iteration corresponding to the increased decoding iteration number: (a) update the V2C message corresponding to the variable node; (b) determine that the variable node is associated with a "j" variable node circulant matrix; (c) determine that the check node connected to the variable node is associated with a "k" check node circulant matrix; (d) determine the reliability of the set of V2C messages as $r_{k,j}$=number of ones in $S_k$/CS, where $r_{k,j}$ is the reliability, $S_k$ is a partial syndrome computed based on the "k" check node circulant matrix, and CS is a checksum determined from the syndrome of the LDPC codeword; (e) compare $r_{k,j}$ to a reliability threshold, wherein the check node processing mode is selected based on the comparing; and (f) update the partial syndrome $S_k$.

In the above example, the set of processing units can be further configured to, during the next decoding iteration corresponding, repeat steps (a)-(f) for remaining variable node circulant matrices and remaining check node circulant matrices.

In an example, an error correction (ECC) system is disclosed. The ECC system includes a set of processing units configured to: receive an LDPC codeword from a memory; determine a variable node to check node (V2C) message, wherein the V2C message corresponds to a variable node that is connected to a check node; determine a reliability of a set of V2C messages comprising the V2C message; select, based on the reliability, a check node processing mode from a plurality of different check node processing modes; and determine a check node to variable node (C2V) message based on the check node processing mode, wherein the LDPC codeword is decoded based on the C2V message.

In the above example, the reliability of the set of V2C messages is determined based on a syndrome of the LDPC codeword and based on a partial syndrome associated with a circulant matrix, wherein the check node is associated with the circulant matrix.

These illustrative examples are mentioned not to limit or define the disclosure, but to provide examples to aid understanding thereof. Additional embodiments and examples are discussed in the Detailed Description, and further description is provided there.

BRIEF DESCRIPTION OF THE DRAWINGS

An understanding of the nature and advantages of various embodiments may be realized by reference to the following figures.

DETAILED DESCRIPTION

Figure 1:
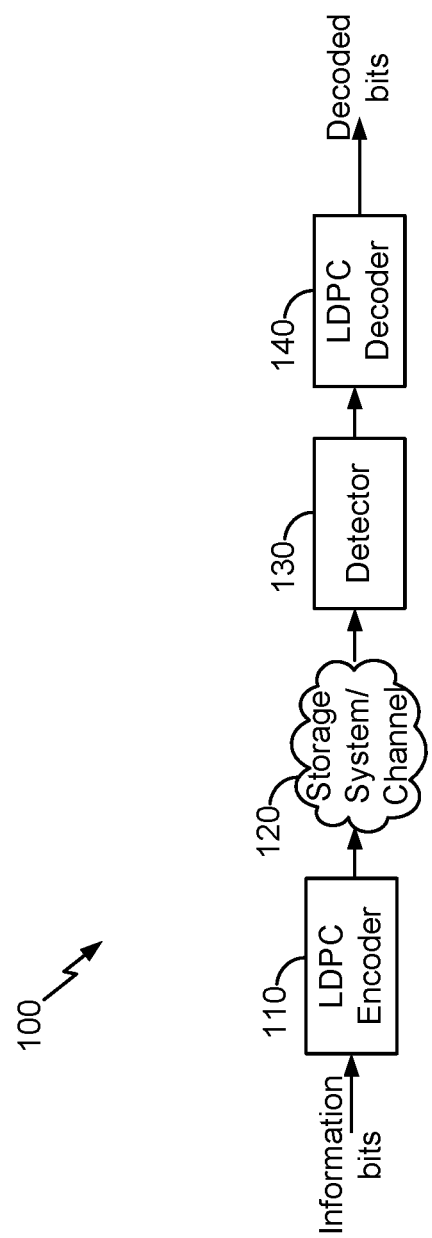
FIG. 1 illustrates an example high level block diagram of an error correcting system, in accordance with certain embodiments of the present disclosure.

Techniques related to improving a power consumption of an ECC decoder are described, where the power consumption can be reduced without impacting or with minimal impact to an error correction capability of the ECC decoder. In an example, the ECC decoder decodes data by using, in part, a message passing algorithm that processes messages, where are output (e.g., "0s" and "1s") based on the messages. The ECC decoder can include one or more processing units. In turn, each processing unit can implement different processing modes. At least two processing modes of a processing unit support different error correction capabilities by implementing one or more operations of the message passing algorithm differently. Each different implementation is associated with a different set of processing cycles and/or hardware components and, thus, results in a different power consumption. The reliability of a message received by a processing unit is estimated, where the estimation is based on, for instance, one or more syndrome-related parameters. Based on the reliability, one of the processing modes is selected and used to generate a response message. In particular, when the reliability indicates that the received message is reliable, a low complexity processing mode (e.g., one consuming a relatively lower power) is selected for the response message. If the reliability indicates that the received message is unreliable, a high complexity processing mode (e.g., one consuming a relatively higher power) is selected for the response message. Overall, most of the passed messages are expected to be reliable and, thus, the high complexity processing mode is used at a low frequency. However, when needed because of unreliability, this high complexity processing mode is selectively used. Accordingly, the overall power consumption of the ECC decoder is reduced, while still maintaining the error correction capability relative to other ECC decoder that do not implement the multi-processing modes and message reliability-based selection of one of the multi-processing modes. When a processing unit implements each of the processing modes in hardware, the ECC decoder may occupy a larger decoder silicon area relative to the other ECC decoder. In other words, a tradeoff is made between silicon area and power consumption, while still maintain the error correction capability.

To illustrate, consider an example of an LDPC decoder. In a decoding iteration, a variable node processing unit sends a variable node to check node (V2C) message to a check node processing unit, where the V2C message corresponds to a variable node that is connected to a check node. The reliability of a set of V2C messages that include the V2C message is estimated based on syndrome-related parameters. The check node processing unit implements different check node processing modes. Each of these modes is used to generate a check node to variable node (C2V) message with a different degree of accuracy (e.g., at a different level of approximation). Based on a comparison of the reliability of the V2C message to one or more reliability thresholds, the check node processing unit selects the most appropriate check node processing mode and generates the C2V message accordingly. The C2V message is sent back to the variable node processing unit and the iterative decoding continues, including the execution of the message passing algorithm, until a maximum number of decoding iterations is reached or the syndrome is zero.

In a further illustration, the LDPC code is a quasi-cyclic (QC) LDPC code. In this illustration, the LDPC decoding relies on circulant submatrices. In particular, each variable node can be associated with a variable node circulant matrix, and each check node can be associated with a check node circulant matrix. The message passing algorithm is performed at a circulant-matrix level. In other words, a variable node processing unit processes information for variable nodes associated with a variable node circulant matrix. Similarly, a check node processing unit processes information for check nodes associated with a check node circulant matrix. The processing can follow a vertical shuffle schedule (VSS). At a start of a current decoding iteration, the syndrome of an LDPC codeword is known (e.g., from the previous decoding iteration or is initialized if the current decoding iteration is the first one). Upon an update of a V2C message corresponding to a variable node connected to a check node, the variable node circulant matrix associated with the variable node is determined (indexed herein as "j" for clarity of explanation; the variable node can be any of the variable nodes "n" associated with the variable node circulant matrix; in an example the variable node is the first one (e.g., "n=1")). The check node circulant matrix associated with the connected check node is determined (indexed herein as "k" for clarity of explanation). Rather than estimating the reliability for each V2C message of a variable node associated with the "j" variable node circulant matrix and per check node of the "k" check node circulant matrix, it is sufficient to estimate the reliability of one of the V2C messages (e.g., the one for the "n" variable node) and the same reliability applies to the remaining V2C messages. Doing so reduces the processing and power consumption of the LDPC decoder. Accordingly, an "$r_{k,j}$" reliability is estimated. The estimation can be a ratio of a partial checksum (e.g., the number of "1's" in the partial syndrome "$S_k$," where the partial syndrome "$S_k$" corresponds to the unsatisfied check nodes associated with the "k" check node circulant matrix) over the LDPC codeword's checksum "CS" determined from the LDPC codeword's syndrome "S." If unreliable (e.g., smaller than a reliability threshold), each of the C2V messages is generated for the check nodes associated with the "k" check node circulant matrix by using a high complexity processing mode of the check node processing unit. If reliable (e.g., larger than the same or a different reliability threshold), each of the C2V messages is generated for these check nodes by using a low complexity processing mode of the check node processing unit. The C2V messages are sent to the variable node processing unit and so on and so forth, until completion of the decoding (e.g., reaching a maximum decoding iteration or until the syndrome "S" is zero).

The embodiments of the present disclosure provide several advantages related to conventional ECC decoders. On one hand, the error correction capability of the ECC decoder is not impacted or is insignificantly impacted. That is because the ECC decoder includes a processing mode that supports the error correction capability and this processing mode is used as needed. On the other hand, the power consumption of the ECC decoder is reduced. That is because the ECC decodes includes at least one other processing mode that supports a lower error correction capability and that more efficiently processes messages (which translated into power consumption savings) and this processing mode is used when the higher error correction capability is not needed. When implemented in hardware, the decoder silicon area may increase. Nonetheless, by employing particular code structures (e.g., QC-LDPC), this increase can be minimized (e.g., the total number of check node processing units can be reduced by processing messages at a check node circulant matrix level).

In the interest of clarity of explanation, various embodiments of the present disclosure are described in connection with LDPC decoders. Nonetheless, the embodiments can similarly apply to other decoder types that rely on a message passing algorithm. In addition, various embodiments of the present disclosure are described in connection with QC-LDPC codes. Nonetheless, the embodiments can similarly apply to other code types, including other type of LDPC codes.

FIG. 1 illustrates an example of a high level block diagram of an error correcting system 100, in accordance with certain embodiments of the present disclosure. In the example, LDPC codes are described in connection with data storage. However, the embodiments of the present disclosure are not limited as such. Instead, the embodiments similarly apply to other usage of LDPC codes including, for example, data transmission.

LDPC codes are linear block codes defined by a sparse parity-check matrix H, which consists of zeros and ones. The term "sparse matrix" is used herein to refer to a matrix in which a number of non-zero values in each column and each row is much less than its dimension. The term "column weight" is used herein to refer to the number of non-zero values in a specific column of the parity-check matrix H. The term "row weight" is used herein to refer to number of non-zero values in a specific row of the parity-check matrix H. In general, if column weights of all of the columns in a parity-check matrix corresponding to an LDPC code are similar, the code is referred to as a "regular" LDPC code. On the other hand, an LDPC code is called "irregular" if at least one of the column weights is different from other column weights. Usually, irregular LDPC codes provide better error correction capability than regular LDPC codes.

The LDPC codes are also described according to the way they are constructed. Random computer searches or algebraic constructions are possible. The random computer search construction describes an LDPC code having a parity-check matrix designed by a random computer-based procedure. Algebraic construction implies that the parity-check matrix has been constructed based on combinatorial methods. Quasi-cyclic LDPC (QC-LDPC) codes fall under the latter construction method. One advantage of QC-LDPC codes is that they have a relatively easier implementation in terms of the encoding procedure. The main feature of QC-LDPC codes is that the parity-check matrix consists of circulant submatrices, which could be either based on an identity matrix or a smaller random matrix. Permutation vectors could also be used in order to create the circulant submatrices.

As illustrated, an LDPC encoder 110 receives information bits that include data which is desired to be stored in a storage system 120. LDPC encoded data is output by the LDPC encoder 110 and is written to the storage 120.

In various embodiments, the storage 120 may include a variety of storage types or media such as (e.g., magnetic, solid state) disk drive storage, flash storage, etc. In some embodiments, the techniques are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), a detector 130 receives data from the storage system 120. The received data may include some noise or errors. The detector 130 performs detection on the received data and outputs decision and/or reliability information. For example, a soft output detector outputs reliability information and a decision for each detected bit (e.g., a logical value of "1" or "0"). On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and/or reliability information is passed to a LDPC decoder 140 which performs LDPC decoding using the decision and reliability information. A soft input decoder utilizes both the decision and the reliability information to decode the codeword. A hard decoder utilizes only the decision values in the decoder to decode the codeword. The decoded bits generated by the LDPC decoder 140 are passed to the appropriate entity (e.g., the user or application which requested it). With proper encoding and decoding, the information bits match the decoded bits.

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

LDPC codes are usually represented by bipartite graphs. One set of nodes, the variable or bit nodes correspond to elements of the codeword and the other set of nodes, e.g., check nodes, correspond to the set of parity-check constraints satisfied by the codeword. Typically the edge connections are chosen at random. The error correction capability of an LDPC code is improved if cycles of short length are avoided in the graph. In a (r,c) regular code, each of the n variable nodes (V1, V2, . . . , Vn) has connections to r check nodes and each of the m check nodes (C1, C2, . . . , Cm) has connections to c bit nodes. In an irregular LDPC code, the check node degree is not uniform. Similarly the variable node degree is not uniform. In QC-LDPC codes, the parity-check matrix H is structured into blocks of p×p matrices such that a bit in a block participates in only one check equation in the block, and each check equation in the block involves only one bit from the block. In QC-LDPC codes, a cyclic shift of a codeword by p results in another codeword. Here p is the size of square matrix which is either a zero matrix or a circulant matrix. This is a generalization of a cyclic code in which a cyclic shift of a codeword by 1 results in another codeword. The block of p×p matrix can be a zero matrix or cyclically shifted identity matrix of size p×p.

Figures 2A, 2B:
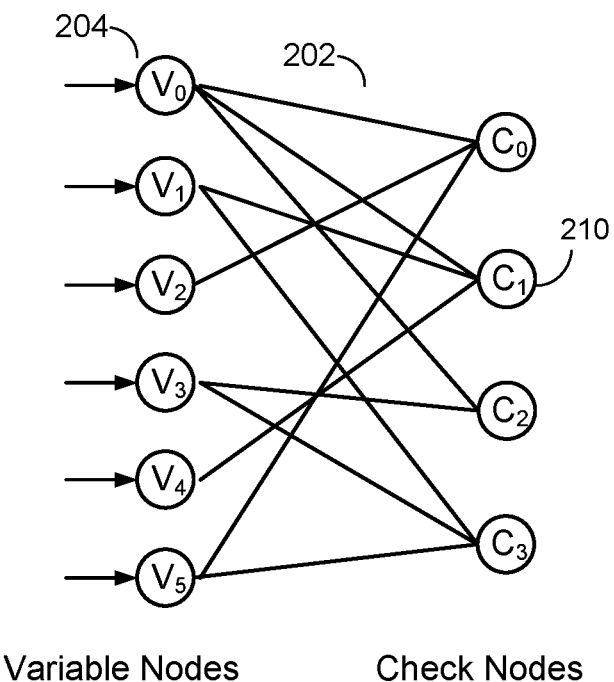
FIG. 2A-2B illustrate an example parity-check matrix and an example graph representing the parity-check matrix, in accordance with certain embodiments of the present disclosure.

FIG. 2A illustrates an example parity-check matrix H 200 and FIG. 2B illustrates an example bipartite graph corresponding to the parity-check matrix 200. In this example, the parity-check matrix 200 has six column vectors and four row vectors, although embodiments of the present disclosure are not limited as such and can similarly be applied to a parity-check matrix with hundreds if not thousands of column vectors and row vectors. Network 202 shows the network corresponding to the parity-check matrix 200 and represent a bipartite graph. Various type of bipartite graphs are possible including, for example, a Tanner graph.

Generally, the variable nodes in the network 202 correspond to the column vectors in the parity-check matrix 200. The check nodes in the network 202 correspond to the row vectors of the parity-check matrix 200. The interconnections between the nodes are determined by the values of the parity-check matrix 200. Specifically, a "1" indicates the corresponding check node and variable nodes have a connection. A "0" indicates there is no connection. For example, the "1" in the leftmost column vector and the second row vector from the top in the parity-check matrix 200 corresponds to the connection between the variable node 204 and the check node 210.

A message passing algorithm is generally used to decode LDPC codes. Several variations of the message passing algorithm exist in the art, such as a min-sum algorithm, scaled min-sum algorithm or the like. In general, any of the variations of the message passing algorithm may be used in an LDPC decoder without departing from the teachings of the present disclosure. Message passing uses a network of variable nodes and check nodes, as shown in FIG. 2B. The connections between variable nodes and check nodes are described by and correspond to the values of the parity-check matrix 200, as shown in FIG. 2A.

A hard decision message passing algorithm may be performed. In a first step, each of the variable nodes sends a message to one or more check nodes that are connected to it. In this case, the message is a value that each of the variable nodes believes to be its correct value.

In the second step, each of the check nodes calculates a response to send to the variable nodes that are connected to it using the information that it previously received from the variable nodes. The response message corresponds to a value that the check node believes that the variable node should have based on the information received from the other variable nodes connected to that check node. This response is calculated using the parity-check equations which force the values of all the variable nodes that are connected to a particular check node to sum up to zero (modulo 2).

At this point, if all the equations at all the check nodes are satisfied, the decoding algorithm declares that a correct codeword is found and it terminates. If a correct codeword is not found, the iterations continue with another update from the variable nodes using the messages that they received from the check nodes to decide if the bit at their position should be a zero or a one by a majority rule. The variable nodes then send this hard decision message to the check nodes that are connected to them. The iterations continue until a correct codeword is found or a maximum number of iterations are performed without finding a correct codeword. It should be noted that a soft-decision decoder works similarly, however, each of the messages that are passed among check nodes and variable nodes, also include reliability of each bit.

An example message passing algorithm may be performed. In this example, $L(q_{ij})$ represents a message that is sent by variable node $v_i$ to check node $c_j$ (e.g., a V2C message); $L(r_{ji})$ represents the message sent by check node $c_j$ to variable node $v_i$ (e.g., a C2V message); and $L(c_i)$ represents initial LLR value for each variable node $v_i$.

Variable node processing for each $L(q_{ij})$ can be done through the following steps:

(1) Read $L(c_i)$ and $L(r_{ji})$ from memory.
(2) Calculate $L(Q_{i\text{-sum}}) = L(c_i) + \text{Scaling Factor} * \Sigma_{j' \in c_i} L(r^{ij'})$.
(3) Calculate each $L(Q_{i\text{-sum}}) - L(r_{ij})$.
(4) Output $L(Q_{i\text{-sum}})$ and write back to memory.
(5) If this is not the last column of the memory, go to Step 1 and increment i by one.
(6) Compute parity-check-sums (e.g., syndrome), if they are all equal to zero, the number of iterations reaches a threshold and the parity-check-sums are greater than another threshold, or the number of iterations equals a maximum limit, stop; otherwise, perform check node processing.

Check node processing for each L(rji) can be performed as follows:

(7) Read one row of qij from memory.
(8) Calculate L(Rj-sum) as follows:

$$L(Rj\text{-sum}) = \left(\prod_{i' \in R_j} \alpha_{i'j}\right) \phi\left(\sum_{i' \in R_j} \phi(\beta_{i'j})\right)$$

$$\alpha_{ij} = \text{sign}(L(q_{ij})), \beta_{ij} = |L(q_{ij})|,$$

$$\phi(x) = -\log\left(\tanh\left(\frac{x}{2}\right)\right) = \log\left(\frac{e^x + 1}{e^x - 1}\right)$$

(9) Calculate the individual $L(r^{ji} = (\prod_{i' \in R_{j\setminus i}} \alpha_{i'j}) \emptyset (\Sigma_{i' \in R_{j\setminus i}} \emptyset (\beta_{i'j}))$ for check nodes.
(10) Write back $L(r_{ji})$ to memory.
(11) If this is not the last row of memory, then go to the first step and increment j by one.

Figure 3:
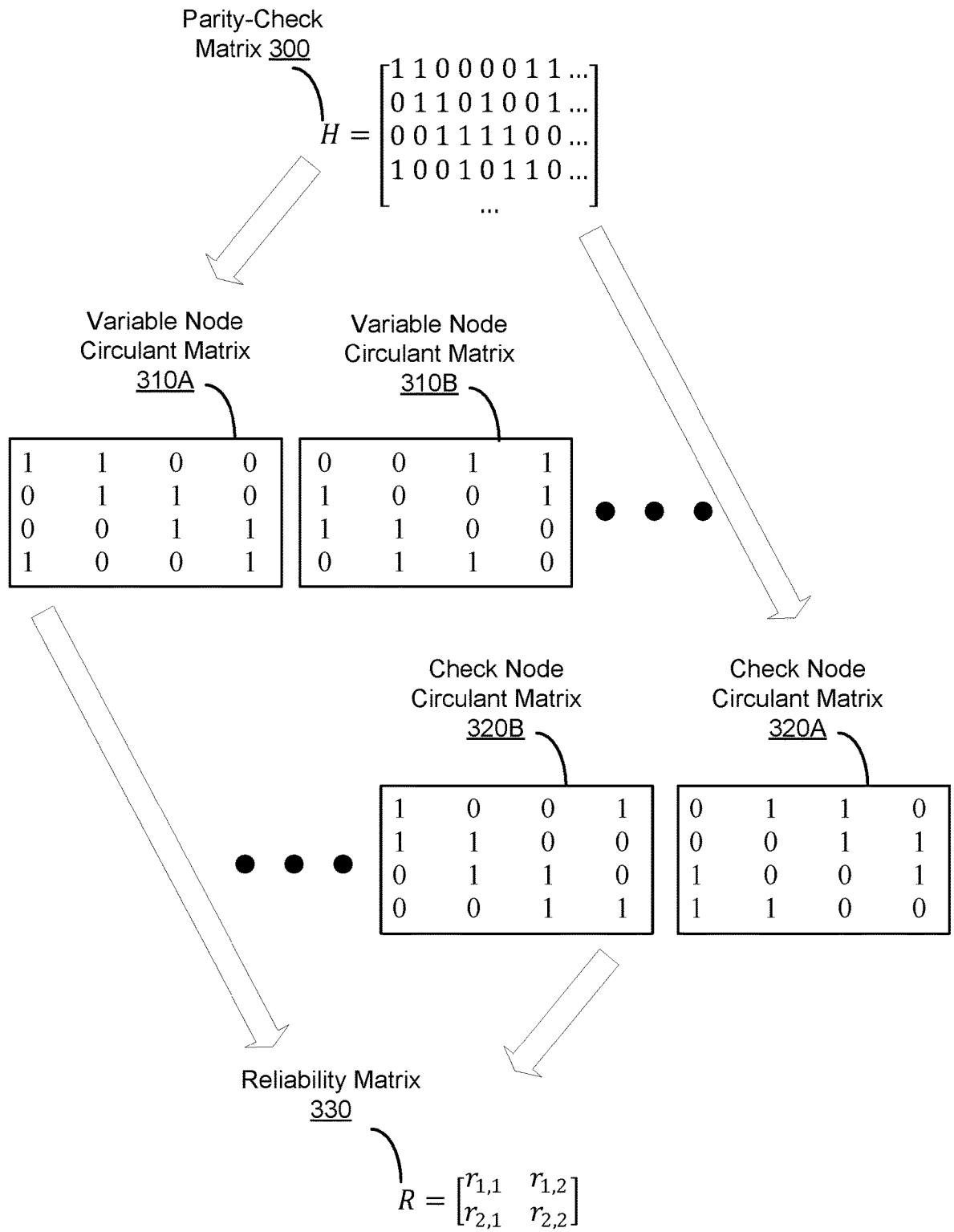
FIG. 3 illustrates examples circulant matrices and an example reliability matrix, in accordance with certain embodiments of the present disclosure.

FIG. 3 illustrates examples circulant matrices and an example reliability matrix, in accordance with certain embodiments of the present disclosure. In an example, a parity-check matrix 300 is defined. As explained herein above, the parity-check matrix 300 can include a number of columns (e.g., in the hundreds if not thousands) and a number (e.g., in the hundreds if not thousands) of rows. Each column represents a variable node, and each row represents a check node.

In the case of QC-LDPC codes, the parity-check matrix 300 follows a circulant structure. In particular, the parity-check matrix 300 includes a number of circulant submatrices, where these circulant submatrices may have a same size or a different size (e.g., each circulant submatrix can have a 256×256 size, or this size can vary). Generally, the circulant submatrices can correspond to variable node circulant matrices and to check node circulant matrices.

A variable node circulant matrix is a matrix from the parity-check matrix 300 that has circulant properties with respect to variable nodes. The columns of the circulant matrix corresponds to a set of variable nodes. Further, the circulant matrix is fully specified by one vector which appears as, for instance, the first column and the remaining columns are each cyclic permutations of this vector with offset equal to the column index.

Similarly, a check node circulant matrix is a matrix from the parity-check matrix 300 that has circulant properties with respect to check nodes. The rows of the circulant matrix corresponds to a set of check nodes. Further, the circulant matrix is fully specified by one vector which appears as, for instance, the first row and the remaining rows are each cyclic permutations of this vector with offset equal to the row index.

In the illustration of FIG. 3, the first eight columns and eight rows of the parity-check matrix 300 correspond to two variable node circulant matrices (labeled in the figure as a variable node circulant matrix 310A and a variable node circulant matrix 310B) and to two check node circulant matrices (shown as a check node circulant matrix 320A and a check node circulant matrix 320B). Each of these circulant matrices 310A, 310B, 320A, and 320B has a 4×4 size. As indicated above, the size can be much larger (e.g. 256×256) and/or can vary (e.g., the variable node circulant matrix 310A may have a 256×256 size, whereas the variable node circulant matrix 310B may have a 128×128 size). In addition, the number of variable node circulant matrix can be different from the number of check node circulant matrices (e.g., in an example, where the parity-check matrix 300 has a 100×30 size and is defined using 10×10 circulant submatrices, ten variable node circulant matrices and three check node circulant matrices can exist).

Considering the illustrated example of the variable node circulant matrix 310A, each of the columns correspond to one of the first four variable nodes (e.g., variable nodes zero through three) and each of the rows correspond to one of the first four check nodes (e.g., check nodes zero through three). The vector of this variable node circulant matrix 310A is $$\begin{bmatrix} 1 \\ 0 \\ 0 \\ 1 \end{bmatrix}.$$

Considering the illustrated example of the check node circulant matrix 320B, each of the columns correspond to one of the first four check nodes (e.g., check nodes zero through three) and each of the rows correspond to one of the next four variable nodes (e.g., variable nodes three through seven). The vector of this check e node circulant matrix 320B is $$\begin{bmatrix} 1 \\ 1 \\ 0 \\ 0 \end{bmatrix}.$$

As seen in the parity-check matrix 300, the first variable node (variable node zero) is connected to the first check node and fourth check node (e.g., check node zero and check node three, respectively). The first variable node is associated with the variable node circulant matrix 310A, but not with the variable node circulant matrix 310B. Each of the first and fourth check nodes is associated with both the check node circulant matrix 320A and the check node circulant matrix 320B. Through these associations, it can be said that the variable node circulant matrix 310A is associated with both the check node circulant matrix 320A and the check node circulant matrix 320B. A same conclusion can be reached in the illustrative example of FIG. 3 when each of the second, third, and fourth variable nodes is considered given the circulant property of the variable node circulant matrix 310A. In comparison, when the fifth variable node (variable node four) is considered in the illustrative example of FIG. 3, it can be concluded that the variable node circulant matrix 310B is associated with both the check node circulant matrix 320A and the check node circulant matrix 320B. Here also, a same conclusion can be reached in the illustrative example of FIG. 3 when each of the sixth, seventh, and eighth variable node is considered given the circulant property of the variable node circulant matrix 310B.

As further described in the next figures, message processing can be improved in terms of power consumption while maintaining the error correction capability performance based on message reliability estimations. The estimation of a single reliability can be performed for a set of messages. The set can consist of one element (e.g., the estimation is performed per message). However, to further reduce the power consumption, the set can include multiple messages. In one example, the set consists of V2C messages that correspond to variable nodes associated with the same variable node circulant matrix. In this example, the message reliability estimation is performed at a variable node circulant matrix level. In comparison to performing the message reliability estimation at a variable node level (e.g., each set consists of one V2C message), processing for the message reliability estimation is saved by a factor equal the size of the variable node circulant matrix.

In the particular illustration of FIG. 3, and as explained herein above, each of the variable node circulant matrix 310A and the variable node circulant matrix 310B is associated with both the check node circulant matrix 320A and the check node circulant matrix 320B. Let the "j" be the index of the variable node circulant matrices (e.g., "j=1" for the variable node circulant matrix 310A and "j=2" for the variable node circulant matrix 310B). Let "k" be the index of the check node circulant matrices (e.g., "k=1" for the check node circulant matrix 330A and "k=2" for the check node circulant matrix 330B). In this example, for the first eight variable nodes and four check nodes of the parity-check matrix, it is sufficient to estimate four message reliabilities "$r_{k,j}$," where "k" varies between one and two and "j" varies between one and two. These four message reliabilities are illustrated with a reliability matrix 330 that has a 2×2 size.

In comparison, if the message reliability is estimated at the variable node level, sixteen different reliabilities would have to be estimated for the first eight variable nodes and four check nodes (two per variable node because each variable node is connected to two check nodes). Thus, by using 4×4 variable node matrices, the number of estimations is reduced by a factor of four from sixteen to four.

In addition, by using a QC-LDPC code (e.g., circulant submatrices in the parity-check matrix 300), VSS scheduling becomes possible. According to the VSS scheduling, sets of variables nodes can be processed in parallel (each set corresponding to a different one of the variable node circulant matrices) and sets of check nodes can be processed in parallel (each set corresponding to a different one of the check node circulant matrices), to speed up the processing of the message passing algorithm.

Figure 4:
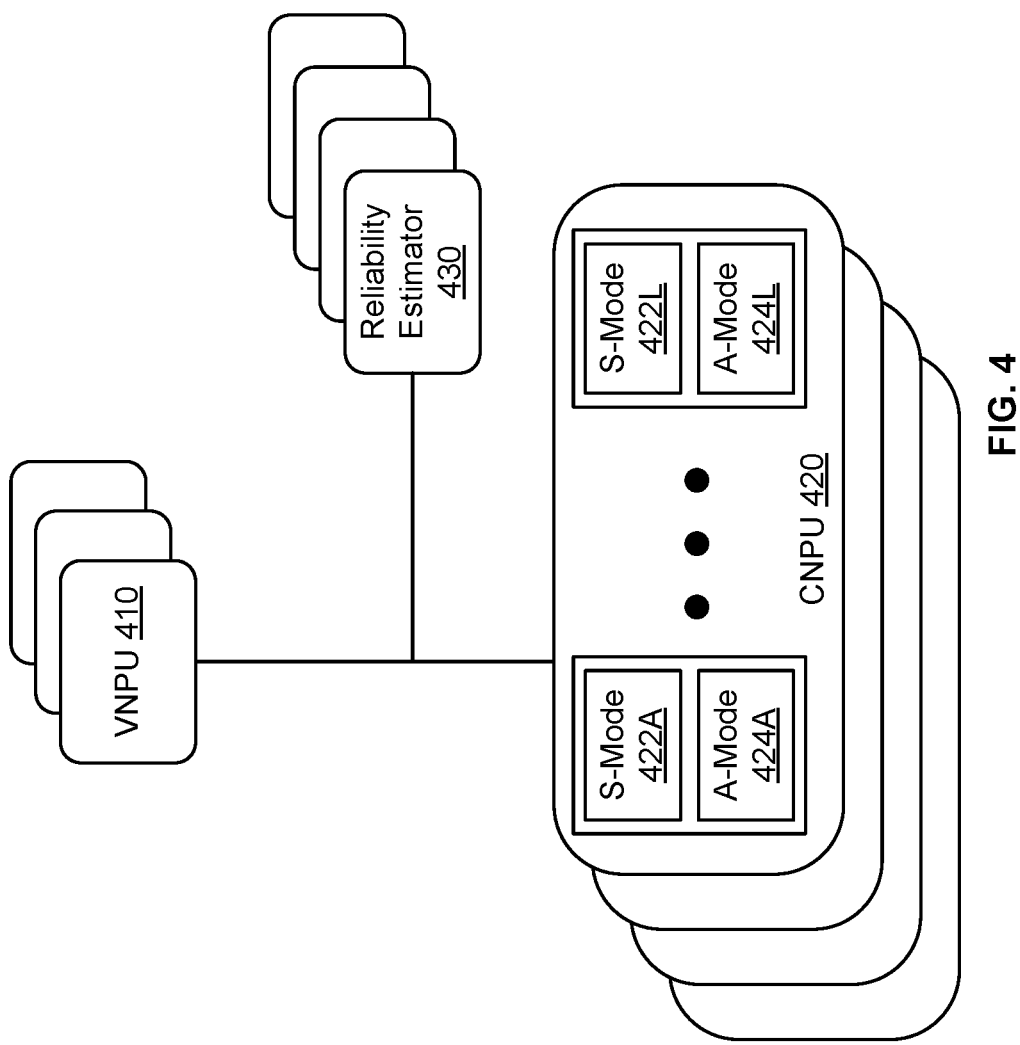
FIG. 4 illustrates an example decoder that includes a plurality of variable node processing units and a plurality of check node processing units, in accordance with certain embodiments of the present disclosure.

FIG. 4 illustrates an example decoder that includes a plurality of variable node processing units 410 (shown as VNPU 410) and a plurality of check node processing units 420 (shown as CNPU 420), in accordance with certain embodiments of the present disclosure. In an example, the decoder is an LDPC decoder that supports QC-LDPC decoding according to VSS scheduling. In this example, the number of variable node processing units 410 can be based on the size(s) of the variable node circulant matrices and on the degree(s) of the check nodes. Similarly, the number of check node processing units 420 can be based on the size(s) of the check node circulant matrices and on the degree(s) of the variable nodes. In addition, the decoder includes a number of reliability estimators 430. This number can be the same or smaller than the number of check node processing units 420. Although illustrated as being separate components, the reliability estimators 430 may be integrated with the variable node processing units 410 and/or the check node processing units 420. A reliability estimator 430 can be implemented in hardware and/or software on a dedicated processing unit or as software on a general purpose processor.

Generally, a reliability estimator 430 computes a reliability of a message passed between nodes. Relatively higher processing and power consumption savings can be achieved when the reliability estimator 430 is used to estimate the reliability of a V2C message to aid in the computation of a C2V message because the C2V message computation is relatively more complex than that of the V2C message (e.g., uses a "tan h" computation instead of a "sum" computation, as described in FIGS. 2A-2B). In other words, while it is possible to implement reliability estimators for estimating the reliability of both types of messages (e.g., C2V and V2C), sufficient processing and power consumption savings are achieved by implementing the reliability estimators for estimating the V2C message reliabilities, such that implementing the reliability estimators for estimating the C2V message reliabilities may not be needed.

Different techniques exist for computing a reliability of a V2C message. One way is to use a belief propagation (BP) method. However, the BP method uses a large hardware area, consumes more power (relative to the syndrome-based method disclosed herein next) and necessitates long decoding-latency. Generally, a tradeoff is made to balance between correction performance, hardware area, power consumption, and decoding latency. In the present disclosure, the syndrome-based method provides an improved balance. In particular, additional hardware area may be used to implement multiple approximations which, in turn, can be used to reduce power consumption dynamically without reducing correction performance. To achieve low latency, an estimation of the reliability of each circulant matrix (e.g., applicable to QC-LDPC codes) and a comparison to a degree-dependent threshold are used. The reliability estimation uses very little computation and the computation can be performed in parallel when vertical scheduling is used. The reliability estimation depends on the information in check nodes and need not involve additional reads of the variable node memory. This allows a low latency decoding.

In an example of the syndrome-based method, a reliability of a V2C message is estimated based on syndrome-related parameters. For instance, when QC-LDPC decoding with VSS scheduling is used, the reliability of a V2C message is "$r_{k,j}$=number of ones in $S_k$/CS," where $r_{k,j}$ is the reliability of the V2C message, "$S_k$" is a partial syndrome computed based on the "k" check node circulant matrix with, "number of ones in $S_k$" is a partial checksum, and "CS" is the checksum of the LDPC codeword.

To illustrate, and referring back to FIG. 3, for "k=1" and "j=1", the reliability "$r_{1,1}$" is equal to the ratio of the number of ones in the partial syndrome "$S_1$" over the checksum of the LDPC codeword. The partial syndrome "$S_1$" is computed based on the check node circulant matrix with "k=1" (e.g., the check node circulant matrix 320A), such as based on the number of unsatisfied check nodes that are associated with this check node circulant matrix (e.g., the number of unsatisfied check nodes zero to three). For any variable node associated with the variable node circulant matrix with "j=1" (e.g., the variable node circulant matrix 310A; in this case, any of variable nodes zero to three) and connected to a check node associated with the check node circulant matrix with "k=1" (e.g., connected to one of the check nodes zero to three), the estimated reliability "$r_{1,1}$" applies to the V2C message from that variable node to the connected check node.

A variable node processing unit 410 can be implemented in hardware and/or software on a dedicated processing unit that performs operations corresponding to or approximating operations (1) through (6) described in connection with FIGS. 2A and 2B. Alternatively, the variable node processing unit 410 can be implemented as software on a general purpose processor to perform operations (1) through (6). In both examples, the variable node processing unit 410 generates a V2C message for a variable node, where this V2C message is L(qij).

A check node processing unit 420 can be implemented in hardware and/or software on a dedicated processing unit that performs operations corresponding to or approximating operations (7) through (10) described in connection with FIGS. 2A and 2B. Alternatively, the check node processing unit 420 can be implemented as software on a general purpose processor to perform operations (7) through (10). In both examples, the check node processing unit 420 generates a C2V message for a check node, where this C2V message is $L(r_{ji})$.

Furthermore, the check node processing unit 420 can implement multiple check node processing modes. A check node processing mode computes or approximates some or all of the functions used to generated the C2V message including for instance any of the "Ø," "tan h," or "log" functions described in connection with operations (8) and (9). For instance, the check node processing mode may quantize the "Ø" function at a particular quantization level (e.g., two-bit quantization for four LLR levels, four-bit quantization for sixteen LLR levels, or the like).

In the illustrative example of FIG. 4, the check node processing unit 420 implements two check node processing modes: a simple mode 422A and an accurate mode 424A (although a larger number of check processing modes is possible). The simple mode 422A approximates the "Ø" function with a two-bit quantization (e.g., to compute "$Ø_s$"), whereas the accurate mode 424A "Ø" function with a four-bit quantization (e.g., to compute "$Ø_a$"). In this way, the simple mode 422A is relatively less processing heavy (and, thus, more power efficient) than the accurate mode 424A, whereas the accurate mode 424A is more precise than the simple mode 422A. Accordingly, if a reliability associated with an incoming V2C message is low, the accurate mode 424A can be used to precisely compute the corresponding C2V message. Conversely, if the reliability associated with the incoming V2C message is high, the simple mode 422A can be used to efficiently compute the corresponding C2V message. Of course, the two-bit and four-bit quantizations are mere examples and other ways to efficiently or precisely compute the C2V message are possible.

In the further illustration of FIG. 4, when VSS scheduling is followed, the check node processing unit 420 includes a plurality of each type of check node processing mode (e.g., a plurality of simple modes, illustrated as simple mode 422A through simple mode 422L, and a plurality of accurate modes, illustrated as accurate mode 424A through accurate mode 422L). In this way, the check node processing unit 420 can process a plurality of check nodes in parallel (e.g., the number of the plurality of check nodes is "L").

To illustrate, and referring back to FIG. 3, consider the example where variable node zero sends a V2C message to check node zero. In this case, the reliability "$r_{1,1}$" is used and is compared to a reliability threshold "θ." If "$r_{1,1}$<θ," the simple mode 422A is used to compute "$Ø_s$." Otherwise, the accurate mode 424A is used to compute "$Ø_a$." The reliability threshold "θ" can be defined heuristically and/or through experimentation. The reliability threshold "θ" can also be dynamic, where its value may change depending on the decoding iteration number, the degree of the variable node (or the degree of the variable node circulant matrix with which the variable node is associated), and/or the degree of the check node (or the degree of the check node circulant matrix with which the check node is associated).

Figure 5:
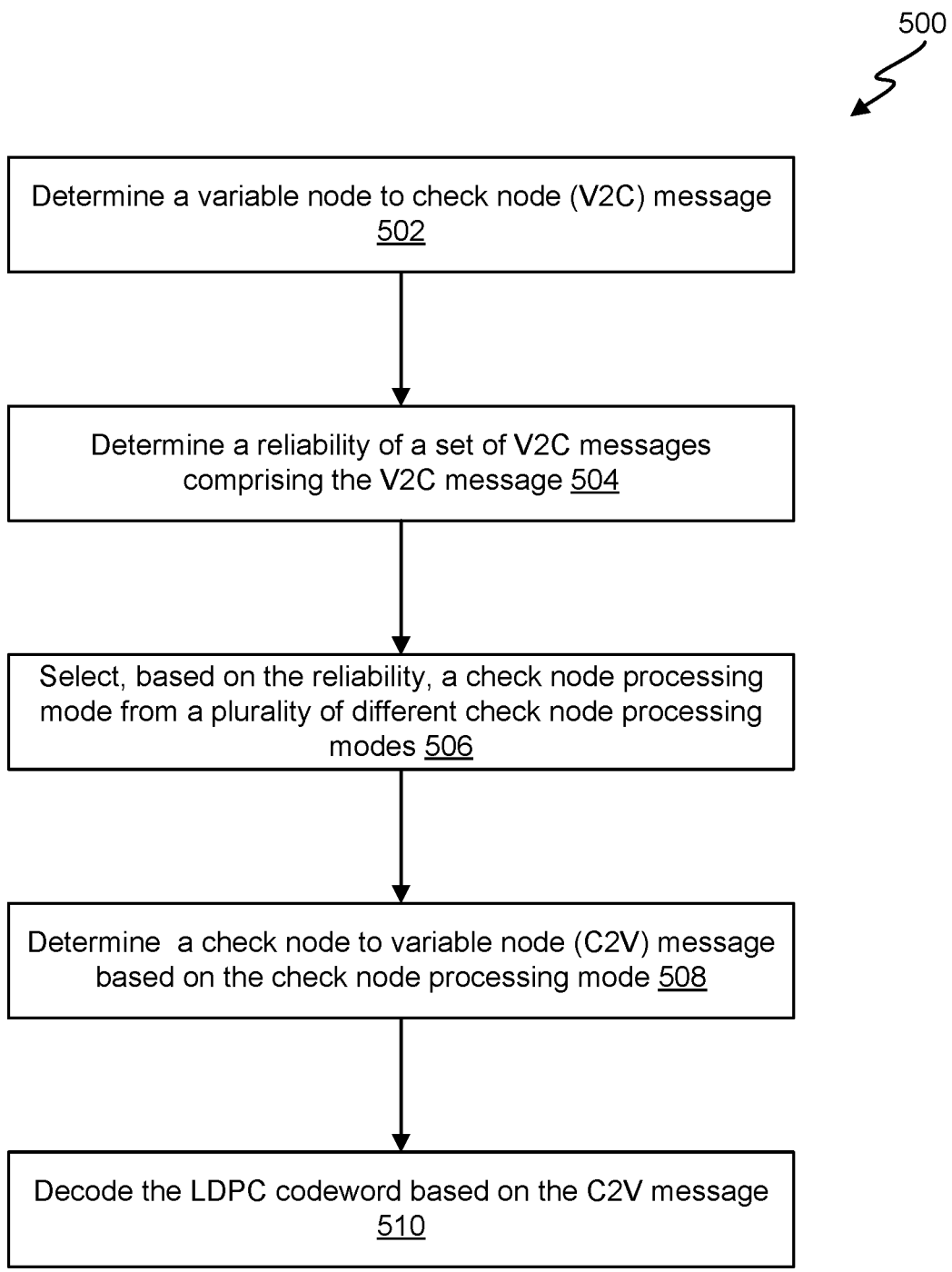
FIG. 5 illustrates an example flow for codeword decoding based on of message reliability estimations, in accordance with certain embodiments of the present disclosure.
Figure 6:
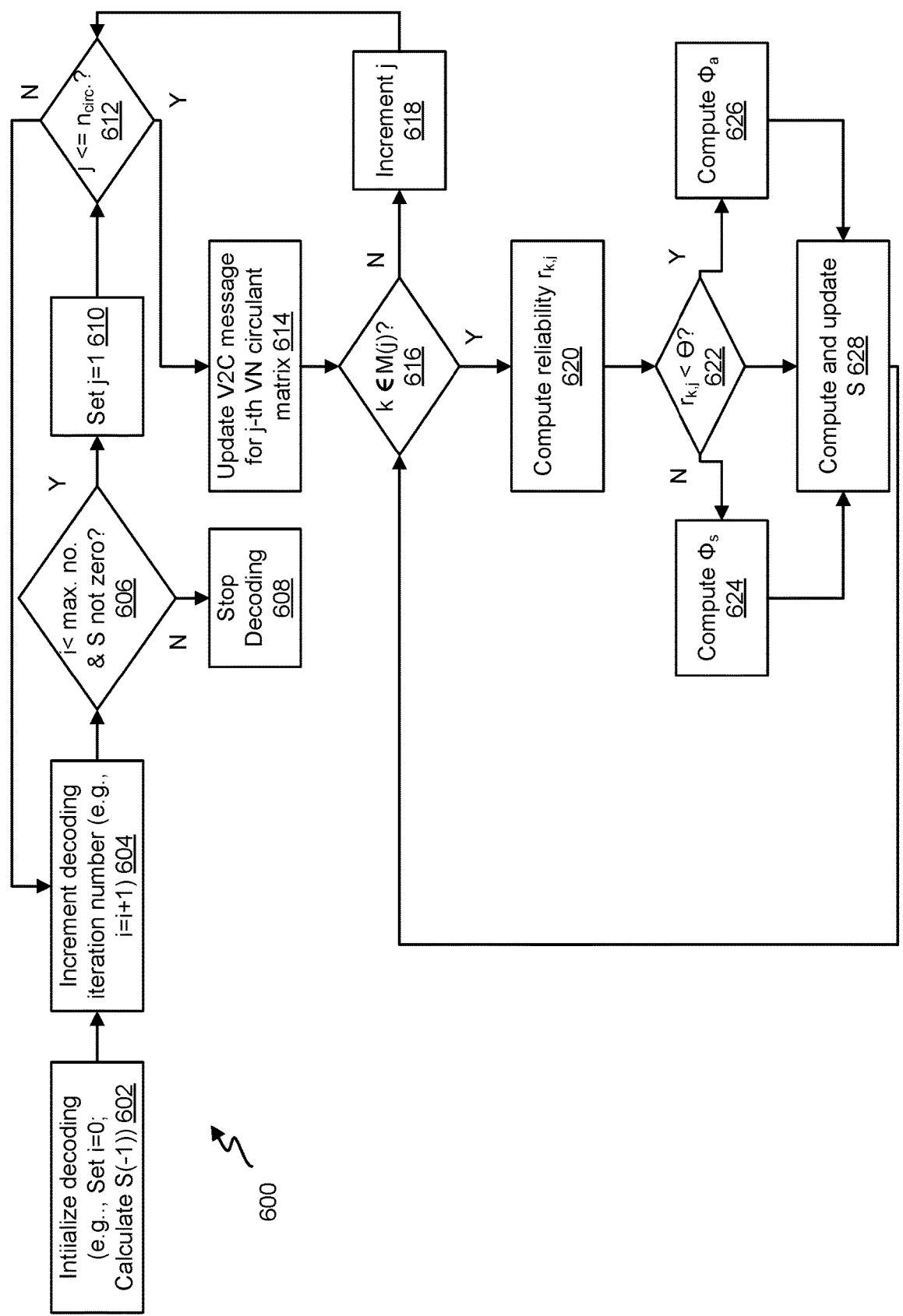
FIG. 6 illustrates a more detailed example flow for codeword decoding based on message reliability estimations, in accordance with certain embodiments of the present disclosure.

FIGS. 5-6 illustrate example flows for decoding codewords using, in part, a message passing algorithm. An error correction system that includes a decoder, such as an LDPC decoder, is described as performing particular operations of the example flows. This system is an example of the error correction system 100 of FIG. 1. In an example, the error correction system includes one or more processors and one or more memories. The memory(ies) stores computer-readable instructions to embody functionalities specific to the error correction system. The instructions when executed by the processor(s) of the system result in performance of the functionalities by the system. The instructions stored in the memory(ies) in conjunction with the underlying processor(s) represent means for performing the functionalities. Further, the decoder includes a set of variable node processing units, a set of check node processing units, and a set of reliability estimators. At least one or more of the check node processing units implement multiple check node processing units and the selection of one of these modes can depend on message reliabilities estimated by one or more of the reliability estimators. The message passing algorithm is implemented by the set of variable node processing units, the set of check node processing units, and the set of reliability estimator, where the implementation can be in dedicated hardware and/or software executing on a general purpose processor. Here also, the dedicated hardware and/or the executable instructions on the general purpose processor represent means for performing the functionalities. Although the operations are illustrated in a particular order, other arrangements of the operations are possible and some of the operations may be skipped as it would be apparent to a person skilled in the art.

FIG. 5 illustrates an example flow 500 for codeword decoding based on of message reliability estimations, in accordance with certain embodiments of the present disclosure. An LDPC codeword is stored in a memory of a device that implements the error correction system. The LDPC codeword is read (e.g. by a detector, such as the detector 120 of FIG. 1) from the memory and may include a number of errors. The decoder iteratively decodes the LDPC codeword to correct the errors and output decoded bits.

As illustrated, the flow 500 includes operation 502, where the error correction system determines a variable node to check node (V2C) message. In an example, the V2C message corresponds to a variable node that is connected to a check node and is determined by a variable node processing unit of the decoder. In the example of LDPC codeword, the V2C message is determined by performing operations (1) through (6) as described in connection with FIGS. 2A and 2B and the V2C message is passed to the check node (e.g., is sent to a check node processing unit of the decoder that is handling the check node).

The flow 500 also includes operation 504, where the error correction system determines a reliability of a set of V2C messages comprising the V2C message. In an example, the set consists of only one V2C message (e.g., the V2C message determined at operation 502). In this example, the reliability can be determined based on a degree of the variable node, the syndrome of the LDPC codeword, and other parameters. In another example, the set includes multiple elements. For instance, the set corresponds to a variable node circulant submatrix. Here, the reliability is determined based on a syndrome of the LDPC codeword and a partial syndrome. The partial syndrome is computed based on the check node circulant matrix associated with the check node. In a specific illustration, the reliability is determined as "r=number of ones in $S_k$/CS," where "r" is the reliability, "$S_k$" is the partial syndrome computed based on the check node circulant matrix (e.g., the number of unsatisfied check nodes that are associated with this check node circulant matrix), the "number of ones in $S_k$" is a partial checksum, and "CS" is the checksum of the LDPC codeword.

The flow 500 also includes operation 506, where the error correction system selects, based on the reliability, a check node processing mode from a plurality of different check node processing modes. For instance, the reliability is compared to one or more reliability thresholds "θ's." The number of reliability thresholds "θ's" can be based on the number of check node processing modes (e.g., if this number is "L," the number of reliability thresholds "θ's" is "L−1"; in the example of simple and accurate modes, the number of reliability thresholds "θ's" is one). A reliability threshold "θ" can be defined based on a decoding iteration number, a degree of the variable node, and/or a degree of the check node. Depending on the comparing, the check node processing mode is selected as the mode corresponding to the resulting range of the reliability (e.g., in the example of simple and accurate modes, if the reliability is smaller than the reliability threshold "θ," the simple mode is selected; otherwise, the accurate mode is selected).

The flow 500 also includes operation 508, where the error correction system determines a check node to variable node (C2V) message based on the check node processing mode. In an example, the check node processing mode approximates operations (7) through (10) described herein above in connection with FIGS. 2A and 2B. Generally, the higher the reliability is (as determined based on the comparison described in connection with operation 506), the more precise the approximation of the check node processing mode is, but the less power efficient this check node processing mode is. Conversely, the lower the reliability is (as determined based on the comparison described in connection with operation 506), the less precise the approximation of the check node processing mode is, but the more power efficient this check node processing mode is. In the example of the simple and accurate modes, the simple mode is a first check node processing mode, and the accurate mode is a second check node processing mode. The first check node processing mode approximates a log likelihood ratio of the variable node based on a first quantization level. The second check node processing mode approximates the log likelihood ratio of the variable node based on a second quantization level. The second quantization level (e.g., four bit-quantization) is larger than the first quantization level (e.g., two-bit quantization).

The flow 500 also includes operation 510, where the error correction system decodes the LDPC codeword based on the C2V message. For instance, the C2V message is sent to the variable node processing unit, and operations 502-508 are performed for the different variable nodes and check nodes and iteratively repeated for multiple decoding iterations until a maximum iteration number is reached or the syndrome of the LDPC codeword is zero. At that point, the decoded bits are output by the error correction system as the decoded LDPC codeword.

To illustrate, and in the case of QC-LDPC decoding, during a decoding iteration, the syndrome of the LDPC codeword is computed, the decoding iteration number is increased, and a determination is made whether the increased decoding iteration number does not exceed a maximum number and whether the syndrome is not zero. If the maximum number is reached or the syndrome is zero, the decoding ends. otherwise, the decoding proceeds to the next decoding iteration. During the next decoding iteration corresponding to the increased decoding iteration number, the V2C message corresponding to the variable node is updated (e.g., per operation 502), a determination is made that the variable node is associated with a "j" variable node circulant matrix, a determination is made that the check node connected to the variable node is associated with a "k" check node circulant matrix, and the reliability of the set of V2C messages is determined as "$r_{k,j}$=number of ones in $S_k$/CS", where "$r_{k,j}$" is the reliability, "$S_k$" is a partial syndrome computed based on the "k" check node circulant matrix, and "CS" is the checksum of the LDPC codeword. In addition, the reliability "$r_{k,j}$" is compared to a reliability threshold "θ." The check node processing mode is selected based on the comparing (e.g., if only one reliability threshold "θ" is used, along with a simple mode and an accurate mode, if the reliability "$r_{k,j}$" is smaller than reliability threshold "θ," the simple mode is selected; otherwise, the accurate mode is selected). Upon computations of the various C2V messages corresponding to the check nodes associated with the check node circulant matrix, the partial syndrome "$S_k$" is updated (e.g., as a function of the number of such check nodes that are not satisfied). During this next decoding iteration, some or all of the sub-operations can be repeated for remaining variable node circulant matrices and remaining check node circulant matrices.

FIG. 6 illustrates a more detailed example flow 600 for codeword decoding based on message reliability estimations, in accordance with certain embodiments of the present disclosure. Operations of the flow 600 can be implemented as sub-operations of some or all of the operations of the flow 500, in particular in the case of QC-LDPC decoding.

As illustrated, the flow 600 starts at operation 602, where the error correction system initializes the decoding. For instance, a decoding iteration number "i" is set to zero. And the syndrome "S" of the LDPC codeword is initialized as "$S^{(-1)}$," where "$S^{(-1)}=yH^T$," and where "y" corresponds to the output of the detector (e.g., hard decoding based on read voltage levels) and "$H^T$" is the transpose of the parity-check matrix. Generally, the syndrome "Sm" at a decoding iteration "i" is computed as "$S^{(i)}=[d_0^{(i)}, d_1^{(i)}, \ldots, d_{N-1}^{(i)}]H^T$", where "$d_m^{(i)}$" denotes the decision of variable node "m" at the decoding iteration "i."

The flow 600 also includes operation 604, where the error correction system increments the decoding iteration number (e.g., increases "i" by one such that "i=i+1").

The flow 600 also includes operation 606, where the error correction system determines whether the decoding iteration number, as incremented at operation 604, has reached a maximum number. The error correction system also determines whether the syndrome "$S^{(i)}$" of the LDPC codeword is zero. If the maximum number is reached or the syndrome "$S^{(i)}$" is zero, operation 608 follows operations 606. Otherwise, the flow 600 proceeds to operation 610.

The flow 600 also includes operation 608, where the error correction system stops the decoding. If the syndrome "$S^{(i)}$" is zero, the decoded LDPC codeword is output, where this output is $d^{(i)}=[d_0^{(i)}, d_1^{(i)}, \ldots, d_{N-1}^{(i)}]$. If the syndrome "$S^{(i=maximum\ number)}$" is not zero and the maximum iteration is reached, a decoding failure may be declared.

The flow 600 also includes operation 610, where the error correction system sets "j" to one. Here, "j" is the index of a variable node circulant matrix. For instance, in the case of a 100×300 parity-check matrix, with 10×10 circulant submatrices, "j" can vary between one and "$n_{circ}$," where "$n_{circ}$" is the total number of variable node circulant matrices and, in this example, "$n_{circ}$" is one-hundred over ten (e.g., ten).

The flow 600 also includes operation 612, where the error correction system determined whether "j" is smaller or equal to the total the total number of variable node circulant matrices "$n_{circ}$." If so, operation 614 follows operation 610. Otherwise, the flow 600 loops back to operation 604 to increment the decoding iteration number "i."

The flow 600 also includes operation 614, where the error correction system update the V2C message for each variable node that is associated with the variable node circulant matrix having the index "j." In particular, each of such V2C messages can be update by a variable node processing unit according to operations (1) through (6) described herein above in connection with FIGS. 2A and 2B.

The flow 600 also includes operation 616, where the error correction system determines the set of check node circulant matrices, where each of these matrices is associated with the variable node circulant matrix having the index "j" (e.g., as described in connection with the circulant matrices of FIG. 3). This set is denoted as "M(j)." Each of the check node circulant matrices of the set "M(j)" has an index "k." At operation 616, the error correction system further determines whether each of the check node circulant matrices of the set "M(j)" has been processed (illustrated in the figure with "k∈M(j)"). If so, operation 618 follows operation 616. Otherwise, the flow 600 proceeds to operation 620, such that unprocessed check node circulant matrices of the set "M(j)" are processed.

The flow 600 also includes operation 618, all of the check node circulant matrices of the set "M(j)" have been processed. Accordingly, the error correction system increments the index "j" and the flow 600 loops back to operation 612.

The flow 600 also includes operation 620, some or all of the check node circulant matrices of the set "M(j)" have not been processed. Accordingly, and for each of unprocessed check node circulant matrix having a particular value for index "k," the error correction system computes the reliability as "$r_{k,j}$=number of ones in $S_k$/CS", where "$r_{k,j}$" is the reliability, "$S_k$" is a partial syndrome computed based on the "k" check node circulant matrix, and "CS" is the checksum of the LDPC codeword and corresponds to the number of ones in the syndrome $S^{(i-1)}$.

The flow 600 also includes operation 622, where the error correction system compares the reliability to a set of reliability threshold "θs." In the illustrative example of FIG. 6, this set consists of a single "θ" in support of a simple mode and an accurate mode. If smaller than the reliability threshold "θ," operation 624 follows operation 622, whereby the simple mode is selected. Otherwise, operation 626 follows operation 622, whereby the accurate mode is selected.

The flow 600 also includes operation 624, where the error correction system updates the C2V messages corresponding to the check nodes associated with the "k" check node circulant matrix. The update includes using the simple mode, where, for instance, the simple function "$Ø_s$" is computed. Operation 628 follows operation 624.

The flow 600 also includes operation 626, where the error correction system also updates the C2V messages corresponding to the check nodes associated with the "k" check node circulant matrix. Here, however, the update includes using the accurate mode, where, for instance, the accurate function "$Ø_a$" is computed. Operation 628 follows operation 626.

The flow 600 also includes operation 628, where the error correction system computes and updates the syndrome "$S^{(i)}$." In an example, rather than updating the entire syndrome "$S^{(i)}$," the update is specific to the partial syndrome "$S_k^{(i)}$," per the completion of the processing of the "k" check node circulant matrix. The partial syndrome "$S_k^{(i)}$" is the syndrome computed based on the unsatisfied check nodes corresponding to "k" check node circulant matrix during the decoding iteration "i." In this case, the flow 600 loops back to operation 616 (however, if the syndrome "$S^{(i)}$" was updated all at once rather than through multiple updates, each for a partial syndrome, the flow 600 can loop back to operation 604).

Figure 7:
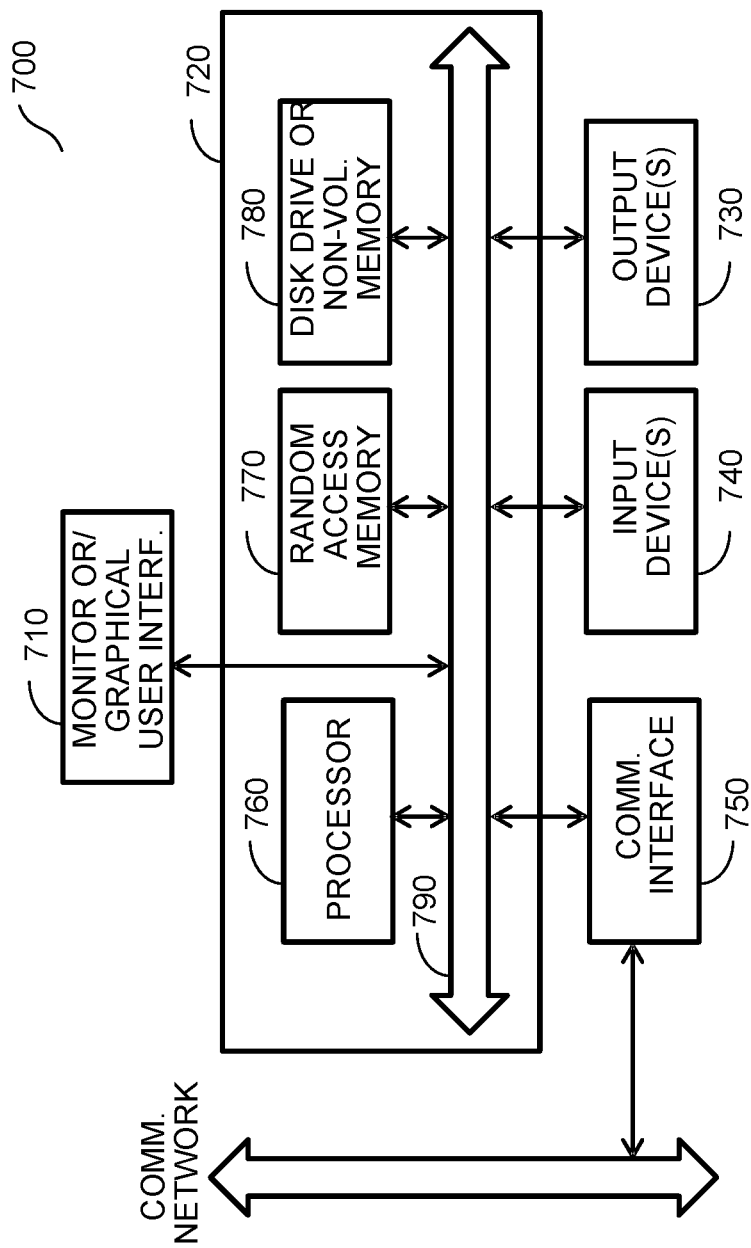
FIG. 7 is representative of a computer system capable of embodying the present disclosure.

FIG. 7 is representative of a computer system 700 capable of embodying the present disclosure. FIG. 7 is merely illustrative of an embodiment of the present disclosure and does not limit the scope of the disclosure as recited in the claims. In one embodiment, the system is a computer system 700 that typically includes a monitor 710, a computer 720, user output devices 730, user input devices 740, communications interface 750, and the like. The error correction system 100 of FIG. 1 implements some or all of the components of the computer system 700.

As shown in FIG. 7, the computer 720 may include a processor(s) 760 that communicates with a number of peripheral devices via a bus subsystem 790. These peripheral devices may include the user output devices 730, the user input devices 740, the communications interface 750, and a storage subsystem, such as random access memory (RAM) 770 and disk drive 780.

The user input devices 740 include all possible types of devices and mechanisms for inputting information to the computer system 720. These may include a keyboard, a keypad, a touch screen incorporated into the display, audio input devices such as voice recognition systems, microphones, and other types of input devices. In various embodiments, the user input devices 740 are typically embodied as a computer mouse, a trackball, a track pad, a joystick, a wireless remote, a drawing tablet, a voice command system, an eye tracking system, and the like. The user input devices 740 typically allow a user to select objects, icons, text and the like that appear on the monitor 710 via a command such as a click of a button or the like.

The user output devices 730 include all possible types of devices and mechanisms for outputting information from the computer 720. These may include a display (e.g., the monitor 710), non-visual displays such as audio output devices, etc.

The communications interface 750 provides an interface to other communication networks and devices. The communications interface 750 may serve as an interface for receiving data from and transmitting data to other systems. Embodiments of the communications interface 750 typically include an Ethernet card, a modem (telephone, satellite, cable, ISDN), (asynchronous) digital subscriber line (DSL) unit, FireWire interface, USB interface, and the like. For example, the communications interface 750 may be coupled to a computer network, to a FireWire bus, or the like. In other embodiments, the communications interfaces 750 may be physically integrated on the motherboard of the computer 720, and may be a software program, such as soft DSL, or the like.

In various embodiments, the computer system 700 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, the computer 720 includes one or more Xeon microprocessors from Intel as the processor(s) 760. Further, one embodiment, the computer 720 includes a UNIX-based operating system.

The RAM 770 and the disk drive 780 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 770 and the disk drive 780 may be configured to store the basic programming and data constructs that provide the functionality of the present disclosure.

Software code modules and instructions that provide the functionality of the present disclosure may be stored in the RAM 770 and the disk drive 780. These software modules may be executed by the processor(s) 760. The RAM 770 and the disk drive 780 may also provide a repository for storing data used in accordance with the present disclosure.

The RAM 770 and the disk drive 780 may include a number of memories including a main random access memory (RAM) for storage of instructions and data during program execution and a read-only memory (ROM) in which fixed non-transitory instructions are stored. The RAM 770 and the disk drive 780 may include a file storage subsystem providing persistent (non-volatile) storage for program and data files. The RAM 770 and the disk drive 780 may also include removable storage systems, such as removable flash memory.

The bus subsystem 790 provides a mechanism for letting the various components and subsystems of the computer 720 communicate with each other as intended. Although the bus subsystem 790 is shown schematically as a single bus, alternative embodiments of the bus subsystem may utilize multiple busses.

FIG. 7 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc., and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A method for decoding a low-density parity-check code (LDPC) codeword, the method implemented on a computing device and comprising:
   determining a variable node to check node (V2C) message, wherein the V2C message corresponds to a variable node that is connected to a check node;
   determining a reliability of a set of V2C messages comprising the V2C message, the reliability representing a certainty of decoding the LDPC codeword, wherein each V2C message in the set of V2C messages corresponds to a different variable node from a set of variable nodes, and wherein the set of variable nodes corresponds to a variable node circulant matrix;
   selecting, based on the reliability, a check node processing mode from a plurality of check node processing modes that have different error correction capabilities;
   determining a check node to variable node (C2V) message based on selection of the check node processing mode; and
   decoding the LDPC codeword based on the C2V message.

2. The method of claim 1, further comprising:
   during a decoding iteration:
      determining a syndrome of the LDPC codeword;
      increasing a decoding iteration number;
      determining that the increased decoding iteration number does not exceed a maximum number; and
      determining that the syndrome of the LDPC codeword is not zero.

3. The method of claim 2, further comprising:
   during a next decoding iteration corresponding to the increased decoding iteration number:
      (a) updating the V2C message corresponding to the variable node;
      (b) determining that the variable node is associated with a "j" variable node circulant matrix;

(c) determining that the check node connected to the variable node is associated with a "k" check node circulant matrix;
(d) determining the reliability of the set of V2C messages as $r_{k,j}$=number of ones in $S_k$/CS, where $r_{k,j}$ is the reliability, $S_k$ is a partial checksum computed based on the "k" check node circulant matrix, and CS is a checksum determined from the syndrome of the LDPC codeword;
(e) comparing $r_{k,j}$ to a reliability threshold, wherein the check node processing mode is selected based on the comparing; and
(f) updating the partial checksum $S_k$.

4. The method of claim 3, further comprising:
during the next decoding iteration, repeating steps (a)-(f) for remaining variable node circulant matrices and remaining check node circulant matrices.

5. The method of claim 1, wherein the reliability of the set of V2C messages is determined based on a syndrome of the LDPC codeword.

6. The method of claim 5, wherein the reliability of the set of V2C messages is further determined based on a partial syndrome associated with a circulant matrix, wherein the check node is associated with the circulant matrix.

7. The method of claim 1, wherein the check node is associated with a check node circulant matrix, wherein the reliability is determined based on a syndrome of the LDPC codeword and a partial syndrome, wherein the partial syndrome is computed based on the check node circulant matrix.

8. The method of claim 7, wherein the reliability is determined as r=number of ones in $S_k$/CS, where r is the reliability, $S_k$ is the partial syndrome, and CS is a checksum determined from the syndrome of the LDPC codeword.

9. The method of claim 1, further comprising:
comparing the reliability to a reliability threshold, wherein the check node processing mode is selected based on the comparing.

10. The method of claim 9, wherein the plurality of different check node processing modes comprises a first check node processing mode and a second check node processing mode, wherein the first check node processing mode approximates a log likelihood ratio of the variable node based on a first quantization level, wherein the second check node processing mode approximates the log likelihood ratio of the variable node based on a second quantization level, wherein the second quantization level is larger than the first quantization level, wherein the first check node processing mode is selected if the reliability is smaller than the reliability threshold, and wherein the second check node processing mode is selected if the reliability is larger than the reliability threshold.

11. The method of claim 9, wherein the reliability threshold is defined based on a decoding iteration number.

12. The method of claim 9, wherein the reliability threshold is defined based on a degree of the variable node.

13. The method of claim 9, wherein the reliability threshold is defined based on a degree of the check node.

14. A device comprising:
a memory storing a low-density parity-check code (LDPC) codeword; and
a set of processing units configured to:
determine a variable node to check node (V2C) message, wherein the V2C message corresponds to a variable node that is connected to a check node;
determine a reliability of a set of V2C messages comprising the V2C message, the reliability representing a certainty of decoding the LDPC codeword, wherein each V2C message in the set of V2C messages corresponds to a different variable node from a set of variable nodes, and wherein the set of variable nodes corresponds to a variable node circulant matrix;
select, based on the reliability, a check node processing mode from a plurality of check node processing modes that have different error correction capabilities; and
determine a check node to variable node (C2V) message based on selection of the check node processing mode,
wherein the LDPC codeword is decoded based on the C2V message.

15. The device of claim 14, wherein the set of processing units is further configured to:
during a decoding iteration:
determine a syndrome of the LDPC codeword;
increase a decoding iteration number;
determine that the increased decoding iteration number does not exceed a maximum number; and
determine that the syndrome of the LDPC codeword is not zero.

16. The device of claim 15, wherein the set of processing units is further configured to:
during a next decoding iteration corresponding to the increased decoding iteration number:
(a) update the V2C message corresponding to the variable node;
(b) determine that the variable node is associated with a "j" variable node circulant matrix;
(c) determine that the check node connected to the variable node is associated with a "k" check node circulant matrix;
(d) determine the reliability of the set of V2C messages as $r_{k,j}$=number of ones in $S_k$/CS, where $r_{k,j}$ is the reliability, $S_k$ is a partial syndrome computed based on the "k" check node circulant matrix, and CS is a checksum determined from the syndrome of the LDPC codeword;
(e) compare $r_{k,j}$ to a reliability threshold, wherein the check node processing mode is selected based on the comparing; and
(f) update the partial syndrome $S_k$.

17. The device of claim 16, wherein the set of processing units is further configured to:
during the next decoding iteration, repeat steps (a)-(f) for remaining variable node circulant matrices and remaining check node circulant matrices.

18. An error correction (ECC) system comprising:
a set of processing units configured to:
receive an LDPC codeword from a memory;
determine a variable node to check node (V2C) message, wherein the V2C message corresponds to a variable node that is connected to a check node;
determine a reliability of a set of V2C messages comprising the V2C message, the reliability representing a certainty of decoding the LDPC codeword, wherein each V2C message in the set of V2C messages corresponds to a different variable node from a set of variable nodes, and wherein the set of variable nodes corresponds to a variable node circulant matrix;

select, based on the reliability, a check node processing mode from a plurality of check node processing modes that have different error correction capabilities; and determine a check node to variable node (C2V) message based on selection of the check node processing mode, wherein the LDPC codeword is decoded based on the C2V message.

19. The ECC system of claim 18, wherein the reliability of the set of V2C messages is determined based on a syndrome of the LDPC codeword and based on a partial syndrome associated with a circulant matrix, wherein the check node is associated with the circulant matrix.

* * * * *